(12) United States Patent
Aoki

(10) Patent No.: US 6,571,057 B2
(45) Date of Patent: May 27, 2003

(54) OPTICAL INSTRUMENT, GAS REPLACEMENT METHOD AND CLEANING METHOD OF OPTICAL INSTRUMENT, EXPOSURE APPARATUS, EXPOSURE METHOD AND MANUFACTURING METHOD FOR DEVICES

(75) Inventor: Takashi Aoki, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/816,226

(22) Filed: Mar. 26, 2001

(65) Prior Publication Data

US 2001/0026354 A1 Oct. 4, 2001

(30) Foreign Application Priority Data

Mar. 27, 2000 (JP) .......................... 2000-087562
Mar. 30, 2000 (JP) .......................... 2000-095637

(51) Int. Cl.$^7$ .............................. G03D 27/42
(52) U.S. Cl. .................. 396/53; 250/492.1; 430/311; 355/67
(58) Field of Search ................. 355/43.45, 53, 355/55, 67–69, 77; 430/311; 250/492.2

(56) References Cited

U.S. PATENT DOCUMENTS

| | | | |
|---|---|---|---|
| 5,602,683 A | | 2/1997 | Straaijer et al. ............. 355/67 |
| 5,906,429 A | * | 5/1999 | Mori et al. ............... 250/492.2 |
| 6,222,610 B1 | * | 4/2001 | Hagiwara et al. ............. 355/30 |
| 6,252,648 B1 | * | 6/2001 | Hase et al. .................... 355/67 |
| 6,268,904 B1 | * | 7/2001 | Mori et al. ............... 250/492.2 |
| 6,288,769 B1 | * | 9/2001 | Akagawa et al. ............. 355/30 |
| 6,335,787 B1 | * | 1/2002 | Nishi .......................... 355/67 |
| 6,341,006 B1 | * | 1/2002 | Murayama et al. ...... 250/492.1 |

FOREIGN PATENT DOCUMENTS

| | | |
|---|---|---|
| EP | 0 874 283 A2 | 10/1998 |
| WO | WO 98/57213 | 12/1998 |
| WO | WO 00/41225 | 7/2000 |

OTHER PUBLICATIONS

"Study on UV/O$_3$ Cleaning by Xe$_2$ Excimer Lamp", J. Illum. Engng. Inst. Jpn., vol. 83, No. 5, 1999, pp. 273–277 (w/ partial translation).

* cited by examiner

Primary Examiner—D. Rutledge
(74) Attorney, Agent, or Firm—Oliff & Berridge PLC

(57) ABSTRACT

According to the present invention, in optical instruments having a plurality of spaces formed in the optical path of an energy beam IL from a light source, a predetermined energy beam is emitted toward the space on a light source side among a plurality of spaces, and the plurality of spaces are subjected to gas replacement from the space on the light source side, sequentially along the traveling direction of the energy beam, by a gas replacement apparatus. As a result, the concentration of light-absorbing substances and concentration nonuniformity in the space on the optical path can be effectively reduced with minimal gas consumption and within a required time.

31 Claims, 9 Drawing Sheets

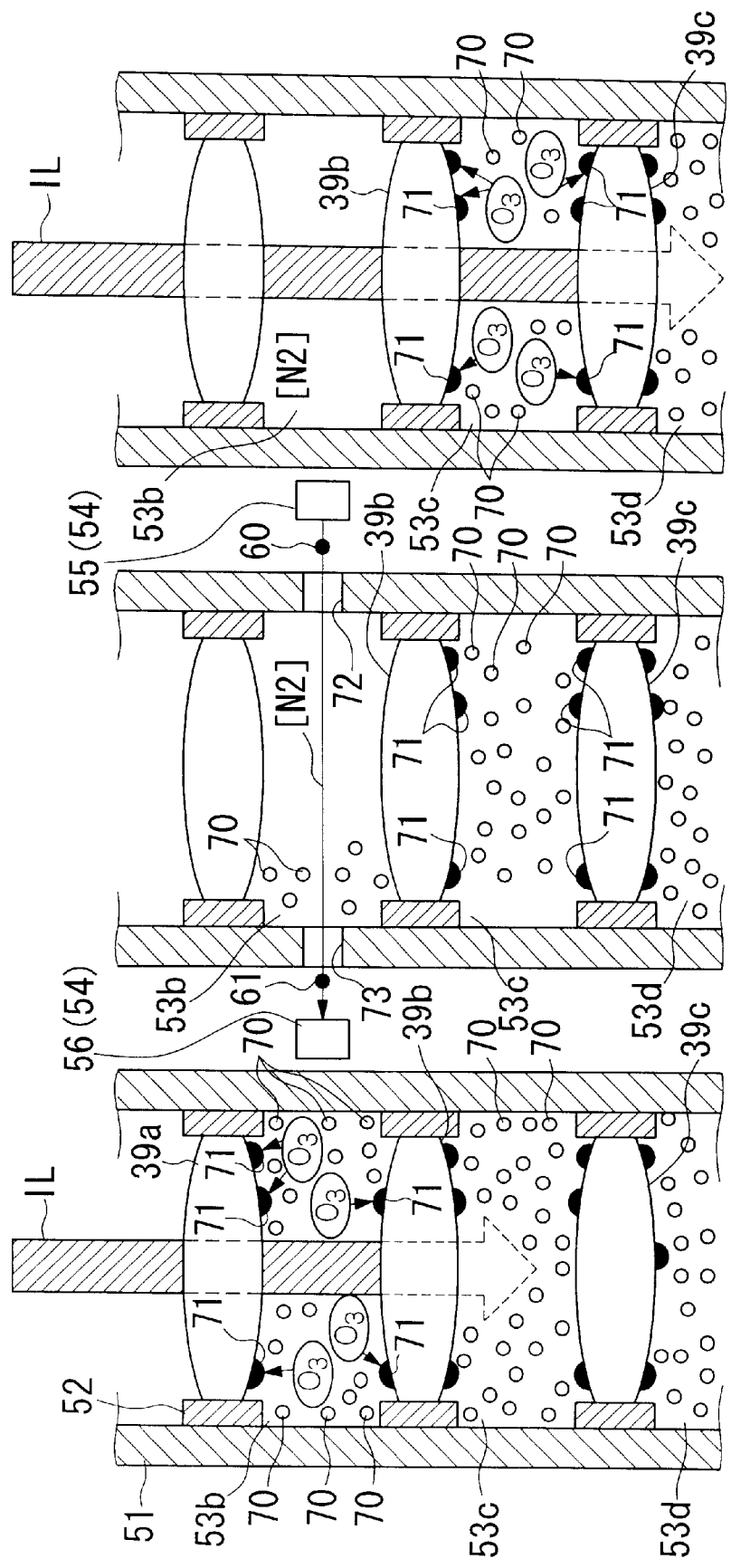

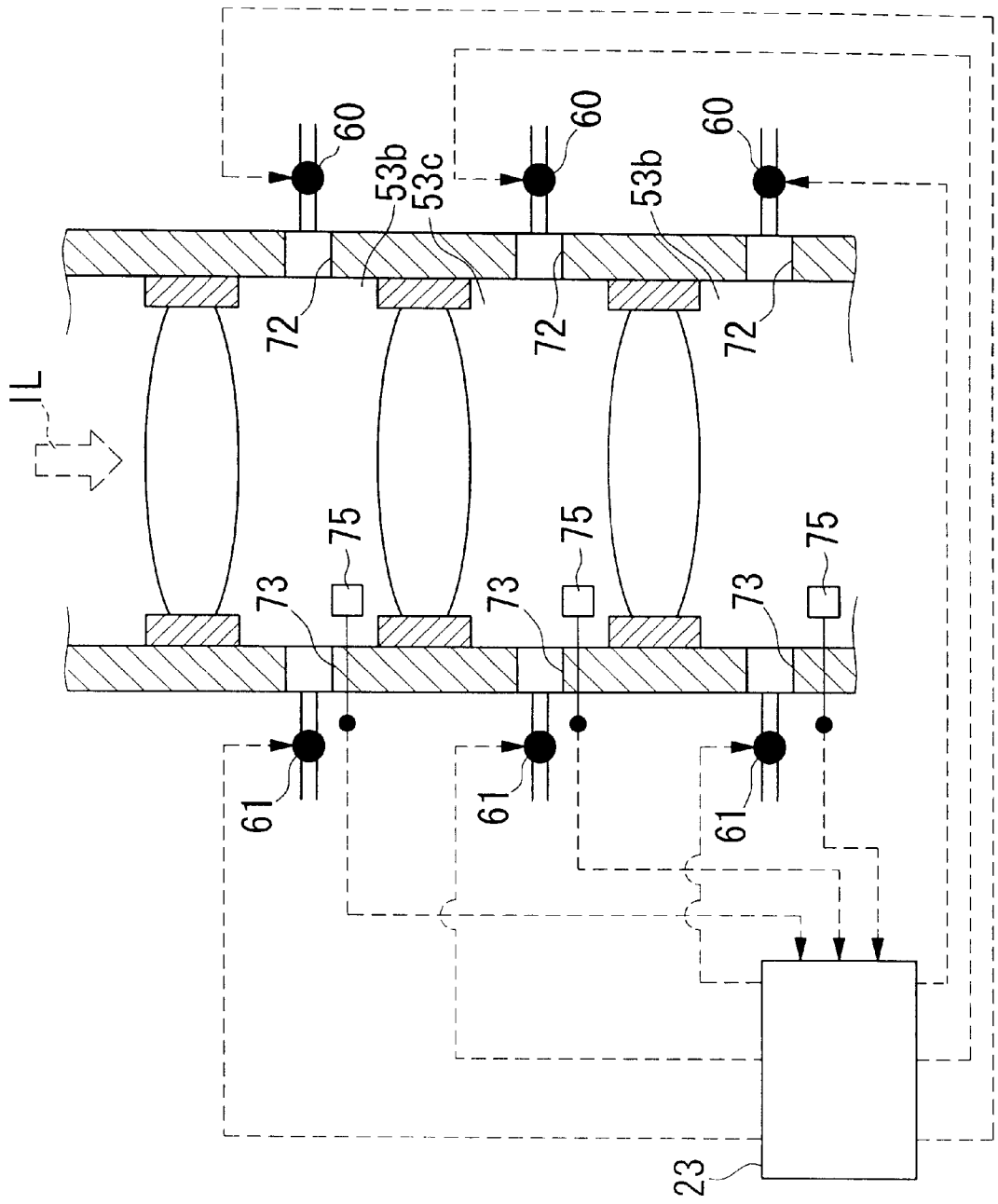

OPTICAL INSTRUMENT, GAS REPLACEMENT METHOD AND CLEANING METHOD OF OPTICAL INSTRUMENT, EXPOSURE APPARATUS, EXPOSURE METHOD AND MANUFACTURING METHOD FOR DEVICES

BACKGROUND OF THE INVENTION

1. Field of the Invention

The present invention relates to an optical instrument having a plurality of spaces formed in the optical path of energy beams, and a gas replacement method and cleaning method thereof. More specifically, the present invention relates to an optical instrument used for an exposure apparatus for manufacturing electronic devices such as semiconductor devices, liquid crystal display devices, imaging devices (CCD or the like), and thin film magnetic heads, and a gas replacement method and a cleaning method of the optical instrument. The present invention also relates to an exposure method using the exposure apparatus and a manufacturing method for devices.

2. Description of the Related Art

When semiconductor devices or liquid crystal display devices are manufactured by a photolithography process, a reduction projection exposure apparatus is used, wherein a pattern image of a reticle is reduced in size and projected onto each projection (shot) area on a wafer, on which a photosensitive material (resist) is applied, via a projection optical system. The circuit in the semiconductor device is transferred by exposing the circuit pattern onto a wafer by the projection exposure apparatus, and is formed by post-processing. Integrated circuits are obtained by laminating the circuit wiring formed in this manner repeatedly, for example, through 20 layers.

Recently, integrated circuits have been integrated in high density, that is, miniaturization of circuit patterns has been advanced. Therefore, the exposure light used for the projection exposure apparatus also tends to have a short wavelength. That is to say, a KrF excimer laser ($\lambda$=248 nm) is now being used, instead of the bright-line of a mercury lamp which has heretofore been the mainstream, and implementation of an ArF excimer laser ($\lambda$=193 nm) having a shorter wavelength is now entering the final stage for practical use. Moreover, research of an $F_2$ laser ($\lambda$=157 nm) has been made, aimed at further high-density integration.

In general, ultraviolet radiation having a wavelength of about 190 nm or less is referred to as vacuum-ultraviolet light, and is not transmitted through the air. This is because light is absorbed by substances such as oxygen molecules, water molecules, and carbon dioxide molecules contained in the air (hereinafter referred to as "light-absorbing substances"). Accordingly, with exposure apparatus using the vacuum-ultraviolet light, light-absorbing substances in the exposure optical path should be reduced or eliminated, in order that the exposure light reaches the wafer face with sufficient illuminance.

Moreover, with an exposure apparatus using the KrF excimer laser beam or the ArF excimer laser beam, there is a problem of a phenomenon referred to as "clouding" of optical members. This is a phenomenon where contaminants adhere to the optical member and cause absorption. Due to this "clouding", it becomes difficult for exposure light having sufficient illuminance to reach the wafer, thereby decreasing the throughput. As the contaminants causing "clouding", there can be considered halides such as plasticizers contained in the covering material of electric wires, exposed to the space where the exposure optical path is formed, organic substances such as machine oil adhered to members constituting the apparatus, or organic substances contained in adhesives or the like.

Currently, measures are taken such that, for non-metal members of the members constituting the exposure apparatus, a substance having less outgassing is used, and for metal members, a substance having low surface roughness is used, the machine oil is completely removed by means of ultrasonic cleaning or the like, and these members are stored in a closed space purged by dry nitrogen. However, it is not easy to prevent outgassing completely, nor to remove the "clouding" completely, and contaminants causing "clouding" adhere to the optical members even during assembly of the apparatus or during operation (during shading pattern exposure).

Therefore, in order to irradiate the exposure light stably onto the substrate, it is necessary to eliminate the light-absorbing substances from the exposure optical path all the time, and to regularly clean the optical members.

With a conventional exposure apparatus, in order to make the exposure light reach the substrate with sufficient illuminance and uniformly, efforts have been made involving replacing the inside of the exposure optical path with low absorbent gas having little energy absorption of vacuum-ultraviolet light, to thereby reduce the light-absorbing substances in the exposure optical path. However, in the case of optical instruments using vacuum-ultraviolet light, since the light is apt to be absorbed by the light-absorbing substances, as described above, it is necessary to keep the concentration of light-absorbing substances contained in the gas within the exposure optical path as low as possible, for example, less than about several ppm. The replacement gas is generally expensive, and the consumption thereof is a problem associated with the running cost of the apparatus. With optical instruments using vacuum-ultraviolet light, since all of a plurality of spaces forming the exposure optical path must be subjected to the gas replacement, the running cost for the gas replacement is large, and its reduction is an important problem. Moreover, in order to replace all the spaces with the replacement gas effectively, without decreasing the operating ratio of the apparatus, it is necessary to reduce the light-absorbing substances in the individual spaces within as short a time as possible. Furthermore, since the rate at which the light-absorbing substances are generated and the inflow quantity are different for each individual space, it is necessary to take measures depending on these spaces.

Also, there has heretofore been a technique for removing contaminants adsorbed in the optical members, referred to as optical cleaning (or light ozone cleaning). With optical cleaning, oxygen gas absorbs ultraviolet light, and is excited to become ozone. Then, the oxygen gas is further converted to oxygen atoms having high reactivity, to react with contaminants adhered to the optical members, and becomes light molecules such as water, carbon dioxide, and is removed. From research up to now, it is known that optical cleaning has low effectiveness where there are no oxygen molecules (J. Illum. Engng. Inst. Jpn. Vol. 83, Nov. 5, 1999, "Verification of UV/O3 Cleaning Using $Xe_2$ Excimer Lamp"). Since the absorption cross section (absorption coefficient) of substances in the vacuum-ultraviolet light is larger than the case of ultraviolet light having a longer wavelength, it is obvious that with an optical instrument using vacuum-ultraviolet light, more reliable measures against "clouding" are required.

However, in the case of light having a low wavelength such as the $F_2$ laser, since the energy is apt to be absorbed by the light-absorbing substances, if the light-absorbing substances are contained in a large amount in the gas within the exposure optical path, the light hardly reaches sufficiently to the space located away from the light source in the optical path, and hence effective optical cleaning cannot be performed with respect to the optical members. Also, in the case of vacuum-ultraviolet light, there is the contradiction that, in order to transfer a pattern with sufficient light volume, it is necessary to eliminate the oxygen molecules, which are light-absorbing substances, but oxygen molecules are necessary for the optical cleaning.

As described above, the vacuum-ultraviolet light is difficult to handle, and considerable labor is required for keeping cleanliness. Consequently, a cost increase, and a decrease in throughput cannot be avoided.

In view of the above situation, it is a primary object of the present invention to provide an optical instrument which can reduce the concentration of light-absorbing substances and the concentration nonuniformity in the optical path effectively, with reduced gas consumption or within a predetermined time, and a gas replacement method for the optical instrument.

An other object of the present invention is to provide an optical instrument which can reliably clean optical members arranged on the optical path, even if vacuum-ultraviolet light is used, and a cleaning method thereof.

It is an other object of the present invention to provide an exposure method, a manufacturing method for devices and an exposure apparatus, which enables highly accurate exposure, without a cost increase nor any decrease in throughput.

SUMMARY OF THE INVENTION

With the present invention, in order to solve the above problems, the construction described below is adopted. That is to say, when explained in association with the drawings, the present invention is characterized by an optical instrument having a plurality of spaces formed in an optical path of an energy beam IL, which comprises a gas replacement apparatus 54 for selectively replacing the gas in at least one of these plurality of spaces. Here, "space" stands for a three-dimensional area surrounded by an object, for example, an internal space of a housing, including either of the space having an airtight structure which is airtightly isolated from an outside air or the space which is applied pressure higher than that of the outside for escaping gas in the space to the outside.

In this case, the optical instrument may have a light source 20 for emitting the energy beam IL, and a control unit 23 which controls the light source 20 and the gas replacement apparatus 54, so that while a predetermined energy beam IL is emitted towards the space on the light source side, among the plurality of spaces, the gas in the plurality of spaces is replaced from the space on the light source side, sequentially along the traveling direction of the energy beam.

Moreover, the gas replacement apparatus 54 may comprise a gas supply device 55 for supplying a predetermined gas to the plurality of spaces, respectively, and a gas exhaust device 56 for exhausting the gas in the spaces, respectively, from the plurality of spaces.

The gas supplied from the gas supply device 55 may also contain an ozone substance or substances which absorb the energy beam IL and generate ozone.

The gas supply device 81 may also comprise a stirring device for stirring the gas in the plurality of spaces.

A supply port 85 and an exhaust port 86 of the gas are arranged, with their height changed from each other, so that the gas in the space is replaced due to a difference of specific gravity between the gas supplied to the space and the gas in the space.

The control unit 23 has at least one of a first measuring device 75 for measuring a concentration of impurities in the gas in the space, and a second measuring device for measuring optical information of the energy beam IL having passed through the plurality of spaces, and either one of the plurality of spaces may be selectively subjected to gas replacement, based on the measurement results of the first and second measuring devices.

Moreover, the present invention is a gas replacement method for an optical instrument having a plurality of spaces formed in an optical path of an energy beam IL from a light source, wherein the predetermined energy beam IL is emitted toward the space on the light source side among the plurality of spaces, and the plurality of spaces are subjected to gas replacement from the space on the light source side, sequentially along the traveling direction of the energy beam IL.

An exposure apparatus 10 of the present invention is also characterized in that at least one of an illumination optical system LO for illuminating a mask R having a pattern formed thereon with an energy beam IL, and a projection optical system PL for transferring the pattern on the mask onto a substrate, is constituted of the above described optical instrument.

The present invention also relates to an exposure method for irradiating light IL, having a first wavelength onto a mask R, and transferring a pattern on the mask onto a substrate W under this light having the first wavelength, wherein before the transfer, optical members 30, 31, 32 arranged in the optical path of the light IL having the first wavelength are irradiated with light CL having a second wavelength longer than the light IL having the first wavelength, to thereby optically clean these optical members.

The present invention also relates to an exposure apparatus for irradiating light IL having a first wavelength to a mask R, and transferring a pattern on the mask onto a substrate W under this light having the first wavelength, which comprises an optical cleaning mechanism 1 which irradiates light CL having a second wavelength longer than the light IL having the first wavelength onto optical members 30, 31, 32 arranged in the optical path of the light IL having the first wavelength, to thereby optically clean these optical members.

The cleaning method of the present invention is a cleaning method of optical members 30, 31, 32 arranged in the optical path of the light IL having the first wavelength, in an exposure apparatus for transferring a pattern on a mask R onto a substrate W under this light having the first wavelength, characterized by irradiating light CL having a second wavelength longer than the light IL having the first wavelength onto the optical members, to thereby optically clean these optical members.

Moreover, the manufacturing method for devices according to the present invention is a manufacturing method for devices manufactured through a transfer step for transferring a pattern of a mask R onto a substrate W under light IL having a first wavelength, characterized by comprising a step, prior to the transfer step, for irradiating light CL having a second wavelength longer than the light IL having the first wavelength onto optical members 30, 31, 32 arranged in the optical path of the light IL having the first wavelength, to thereby optically clean these optical members.

BRIEF DESCRIPTION OF THE DRAWINGS

FIG. 2A is a diagram for explaining an example of a gas replacement method in an optical instrument according to the present invention.

FIG. 2B is a diagram for explaining an example of a gas replacement method in an optical instrument according to the present invention.

FIG. 2C is a diagram for explaining an example of a gas replacement method in an optical instrument according to the present invention.

FIG. 3 is a schema showing an example of an optical instrument comprising a concentration measurement device.

DESCRIPTION OF THE PREFERRED EMBODIMENTS

A first embodiment of the present invention will now be described with reference to FIG. 1 and FIG. 2.

Figure 1:
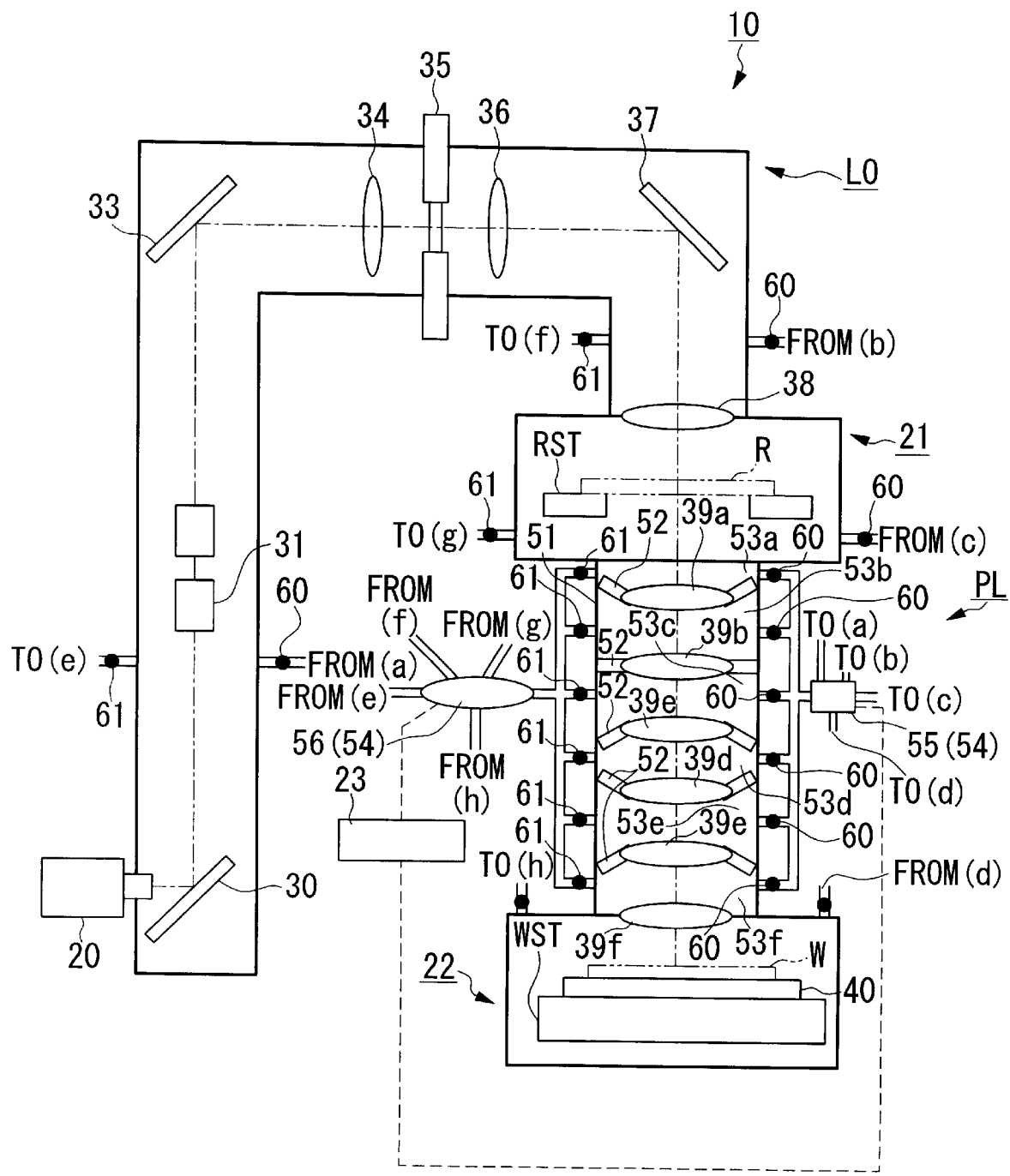
FIG. 1 is a diagram showing a schematic construction of an example of an exposure apparatus comprising an optical instrument according to the present invention.

FIG. 1 shows the schematic construction of an example of an exposure apparatus 10 comprising an optical instrument according to the present invention, as an illumination optical system and a projection optical system.

This exposure apparatus 10 is a scanning type exposure apparatus of a step-and-scan method, a so-called scanning stepper, which transfers a pattern formed on a reticle R to each shot area on a wafer W via a projection optical system PL, while synchronously moving the reticle R as a mask and the wafer W as a substrate in the one-dimensional direction.

The exposure apparatus 10 comprises; a light source 20, an illumination optical system LO for illuminating the reticle R by exposure light IL from this light source 20, a reticle chamber 21 for placing the reticle R, the projection optical system PL for projecting the exposure light IL emitted from the reticle R onto the wafer W, a wafer chamber 22 for placing the wafer W, and a main control unit 23 for supervisingly controlling the entire apparatus.

As the light source 20, an $F_2$ laser beam source outputting pulsed ultraviolet light having a wavelength of 157 nm is used. Moreover, the light source 20 has a light source control unit (not shown) placed side by side, and this light source control unit controls the central emission wavelength and spectral half band width of the emitted pulsed ultraviolet light, and performs trigger control of the pulsed oscillation, gas control in the laser chamber, or the like, in response to instructions from the main control unit 23. The exposure light IL emitted from the light source 20 is shone onto a deflection mirror 30 in the illumination optical system LO.

The illumination optical system LO comprises a plurality of optical instruments, such as the deflection mirror 30, a fly-eye lens 31 as an optical integrator, a deflection mirror 33, a first relay lens 34, a blind 34, a second relay lens 36, a deflection mirror 37 and a condenser lens 38. The exposure light IL reflected by the deflection mirror 30 passes through these optical instruments and enters into the reticle chamber 21. In this case, a load-lens type optical integrator can be used in place of the fly-eye lens In the reticle chamber 21, there is arranged a reticle stage RST which holds the reticle R by, for example, vacuum attraction, and which has a drive system (not shown) for moving the reticle R two-dimensionally. When the exposure light IL is irradiated to the reticle R, imaging luminous flux from an area illuminated by the exposure light, of the circuit pattern area on the reticle R, enters into the projection optical system PL. The reticle R is put into the reticle chamber 21 by a reticle carrying device (not shown), and at the time of gas replacement described later, is discharged from the reticle chamber 21 by the reticle carrying device.

As the projection optical system PL, there is used, for example, a refracting system having a reduction magnification, consisting of a plurality of lens elements 39a to 39f using quartz or fluorite as the optical glass, in which both of the object surface (reticle R) side and the image surface (wafer W) side have a telecentric and circular projection field of view, The exposure light IL having entered into the projection optical system PL passes through these plurality of lens elements 39a to 39f, and enters into the wafer chamber 22.

In the wafer chamber 22, there is arranged a wafer stage WST having a drive system (not shown) for moving the wafer W two-dimensionally. The wafer stage WST comprises a sample holder 40 movable three-dimensionally, and the wafer W is held on the sample holder 40 by vacuum attraction or the like.

Moreover, the position of the reticle stage RST and the wafer stage WST in the two-dimensional plane is respectively measured by shining a laser beam onto interferometer mirrors (not shown) respectively provided on the reticle stage RST and the wafer stage WST, from a laser interferometer (not shown) and reflecting the beam therefrom.

This exposure apparatus 10 has a construction such that sealability of the space in the housing in the illumination optical system LO, the reticle chamber 21, the projection optical system PL and the wafer chamber 22 is increased. For example, with the illumination optical system LO, in order to improve the airtightness of the space in the housing, the above described respective optical members 30 to 38 are divided into a plurality of housings, which are connected with each other via an appropriate connecting member.

Moreover, the projection optical system PL is airtightly partitioned by a plurality of lens spaces 53a to 53f, using each of the lens elements 39a to 39f as partitions, with the above described lens elements 39a to 39f supported in a lens-barrel 51 as a housing via retaining rings 52.

Moreover, the exposure apparatus 10 comprises a gas replacement apparatus 54 for gas replacement of each space in the housing.

The gas replacement apparatus 54 has a gas supply device 55 for supplying a predetermined gas to each space in the housing, and a gas exhaust device 56 for exhausting gas in the space from each space in the housing. The gas supply device 55 and the gas exhaust device 56 are controlled by the main control unit 23.

The gas supply device 55 is for transporting an inert gas (nitrogen, helium, argon or the like), being a replacement gas (purge gas) by, for example, applying pressure, from a gas supply source (not shown) to each space, and for sending the gas to the space in the housing via a supply port provided singly or in a plurality of numbers in the housing. Moreover, the gas supply device 55 is constructed to have a flow regulating mechanism 60 (for example, a flow variable valve) for each space, so as to individually regulate the flow rate of the supplied gas, under control of the main control unit 23.

The gas exhaust device 56 is for exhausting the gas in the space in the housing via one or more exhaust ports provided in the housing, by sucking the gas by, for example, vacuum pressure. Moreover, the gas exhaust device 56 is constructed to have an opening/shutting system 61 for each space, in the vicinity of the exhaust port of the housing, so as to exhaust the gas selectively from at least one space in the housing, under control of the main control unit 23.

The main control unit 23 is constituted of a microcomputer (or a minicomputer) including a CPU (central processing unit), a read-only memory (ROM), a random access memory (RAM) and the like, and performs the various controls described above, as well as general control of the entire apparatus.

Furthermore, at the time of exposure, the reticle stage RST and the wafer stage WST are synchronously moved each other under control of the main control unit 23, so that each shot area on the wafer stage WST is illuminated by the exposure light IL, to thereby expose the pattern image of the reticle R on the surface of the wafer W.

Next, one embodiment of a gas replacement method in the above described exposure apparatus 10 will be described.

With this exposure apparatus 10, at the time of gas replacement, exposure light IL is emitted from the light source 20 as vacuum-ultraviolet light, under control of the main control unit 23, and the space in the housing is subjected to gas replacement from the space on the light source 20 side, sequentially along the traveling direction of the exposure light IL, by the above described gas replacement apparatus 54. FIGS. 2A to 2C are schema showing a procedure of the gas replacement method in this embodiment. Referring to these figures, there are formed a first apace 53b, a second space 53c and a third space 53d, in order from the light source side, as spaces partitioned by optical members (lens elements) 39a, 39b and 39c, in the housing 51 of the exposure apparatus (here, a part of the lens-barrel 51 in the projection optical system PL shown in FIG. 1 is schematically shown as an example). Reference symbol 70 denotes light-absorbing substances contained in the gas, and 71 denotes contaminants adsorbed in the surface of the optical members.

In the description below, it is assumed that in the space within the illumination optical system LO and in the space within the reticle chamber 21, the light-absorbing substances are sufficiently reduced. Moreover, at the time of gas replacement of the space within the projection optical system PL, since drive mechanisms such as the reticle stage in the reticle chamber 21 are in a stopped state, these spaces are not affected by the contaminants generated at the time of driving of these drive mechanisms.

At first, by emitting exposure light IL from the light source 20, the exposure light IL enters into the optical member 39a which constructs the projection optical system PL through the illumination optical system LO and the reticle chamber 21, and this exposure light IL enters into the first space 53b, as shown in FIG. 2A. Hence, in the first space 53b, the light-absorbing substances 70 in the gas absorb the exposure light IL and become an excited state, to thereby generate ozone ($O_3$) having high activity, from the oxygen molecules, being a light-absorbing substance. Here, it is not necessary to exhaust the gas in the first space 53b, before the exposure light IL enters into the first space 53b. That is to say, in the first space 53b before gas replacement, there exist the light-absorbing substances 70, which are used as a material for optical cleaning. Due to this ozone, contaminants 71 adhered to the surfaces of the optical members 39a, 39b facing the first space 53b are oxidation decomposed and removed (optically cleaned), and secondarily generated substances such as water molecules and carbon dioxide molecules are released into the gas.

Here, the optical cleaning mechanism will be briefly described. As the optical cleaning, there can be considered; the case where oxygen molecules receive light to become ozone, and this ozone causes a chemical reaction with contaminants adhered to the surface of the optical element, to thereby become substances such as $H_2O$ or $CO_2$, and are discharged, or the case where contaminants are blown off by light energy, at the time when light is irradiated to the contaminants adhered to the surface of the optical elements. Moreover, there can be considered the case where bonds of molecules are pulled apart, when light is irradiated to the contaminants adhered to the surface of the optical elements, to thereby form molecules having a small mass number, so that the molecules no longer correspond to the light-absorbing substances.

At this time, since the absorption cross section of the light-absorbing substances in the wavelength of the $F_2$ laser beam is large, the exposure light IL is absorbed by the light-absorbing substances (particularly, oxygen molecules) 70 in the first space. Hence, a sufficient quantity of exposure light IL does not enter into the second space 53c, and as a result, optical cleaning is hardly performed in the second space 53c. Moreover, in this embodiment, it is confirmed that the surfaces of the optical members 39a to 39c are optically cleaned sufficiently by irradiating the exposure light IL of a predetermined pulse (for example, 106 pulses). Therefore, after emitting a predetermined amount of exposure light IL from the light source 20, the main control unit 23 (see FIG. 1) controls the gas replacement apparatus 54 to execute the next gas replacement operation.

When the contaminants 71 on the surface of the optical members 39a, 39b facing the first space 53b are removed by means of optical cleaning, then as shown in FIG. 2B, replacement gas (nitrogen [N2], helium, argon, or the like) is supplied by the gas supply device 55, via a flow regulating mechanism 60 and a supply port 72, to the first space 53b, and the gas in the first apace 53b is exhausted by the gas exhaust device 56, via an exhaust port 73 and an opening/shutting system 61. In this first space 53b, substances secondarily generated due to remaining light-absorbing substances 70 and optical cleaning are contained in the gas, but with movement of the gas in the space 53b, these substances are exhausted from the exhaust port 73, and the gas within the first space 53b is replaced by the replacement gas.

As a result, as shown in FIG. 2C, since the concentration of light-absorbing substances in the gas within the first space 53b is reduced, and the contaminants 71 on the surface of the optical members 39a, 39b are removed, the exposure light IL from the light source passes through the first space 53b, and enters into the second space 53c sufficiently. Therefore, subsequently in the second space 53c, ozone is formed, using the light-absorbing substances existing in advance in the second space 53c as a material for optical cleaning, as in the case of the above described first space 53b, and the surfaces of the optical members 39b and 39c facing the second space 53c are optically cleaned by means of this ozone, to thereby remove the contaminants on the surface of the optical members 39b and 39c. Then, the gas in the second space 53c is replaced by the replacement gas by the gas replacement apparatus 54.

In this manner, with this exposure apparatus 10, in each of the illumination optical system LO, the reticle chamber 21, the projection optical system P and the wafer chamber 22 (see FIG. 1), the above described series of operations are performed from the space on the light source side, sequentially along the traveling direction of the exposure light IL. As a result, the gas in the space in the housing is replaced sequentially along the traveling direction of the exposure light IL, so that the concentration and concentration non-uniformity of the light-absorbing substances contained in the gas within these spaces are reduced sequentially. Then, since the concentration of the light-absorbing substances in the space in the housing is reduced, the exposure light IL passes through each space on the optical path, and travels sequentially. As a result, in the space before the gas replacement, ozone is generated from the light-absorbing substances excited by the exposure light IL, and by this ozone, the surfaces of the optical members are optically cleaned effectively from the light source side, sequentially along the traveling direction of the exposure light IL, and the contaminants on the surface of the optical members are removed.

As described above, in the exposure apparatus, since each of the optical members are optically cleaned sequentially along the traveling direction of the exposure light IL and the gas in the space is replaced, the transfer step for transferring the pattern image on the reticle R onto the wafer W can be performed. That is, the pattern on the reticle R is transferred onto the wafer W by emitting the $F_2$ laser beam from the light source 20 after placing the reticle R having the pattern for exposure formed thereon to the reticle chamber 21 and placing the wafer W to the wafer chamber 22.

A plurality of spaces partitioned by each of the optical members of the illumination optical system LO may be formed in the housing of the illumination optical system LO. In this case, each optical members are optically cleaned sequentially along the traveling direction of the exposure light IL from the space on the light source side. Furthermore, a space in the reticle chamber 21 may be provided as the space for the gas replacement in order to use the reticle R as the optical member for optical cleaning.

In addition, in this embodiment, the $F_2$ laser having a wavelength of 157 nm is used as the exposure light IL, however, the ArF excimer laser may be used as the exposure light IL as the after-mentioned fifth embodiment.

At this time, with the progress of the exposure light IL, the space where the optical cleaning has been performed is selectively subjected to gas replacement, and the concentration of the light-absorbing substances is reduced individually for each space. As a result, compared to the case where all spaces are subjected to gas replacement at the same time, the gas consumed at the time of gas replacement of one space and the wastage of required time is minimal. Moreover, in the space before gas replacement, since light-absorbing substances (such as oxygen molecules) contained in the gas existing in the space are used to generate ozone, new gas for promoting optical cleaning or separate processing is not always necessary, at the time of optical cleaning of the optical members.

Furthermore, since supply and exhaust of the gas are performed with respect to each space in the housing, by the gas supply device 55 and the gas exhaust device 56, circulation of the gas in these spaces is promoted, and the time required for gas replacement decreases. Incidentally, the method of performing gas supply and exhaust with respect each space in the housing is not limited to the above described method, and for example, gas containing light-absorbing substances may be exhausted from the above spaces, only by a suction operation due to reduced pressure, using only the gas exhaust device 56. Other methods regarding the gas supply and exhaust will be described in the embodiment described below.

With this exposure apparatus 10, since the concentration and concentration nonuniformity of light-absorbing substances in the optical path IL is reduced, and contaminants adhered to the optical member are removed by the above described gas replacement method, the exposure light IL can reach the wafer W with sufficient illuminance and sufficient uniformity. Moreover, since gas consumption is small, and gas replacement is performed within a short period of time, the operating ratio of the apparatus is improved.

Measures for reducing light-absorbing substances by means of such a series of gas replacement operations are performed, for example, at the time of initial gas replacement when the remaining air contained in large amounts in the apparatus at the time of assembly or initial adjustment is replaced by a predetermined gas, at the time of start-up of the apparatus, or at the time of regular maintenance. That is to say, at the time of the actual exposure operation when printing of a circuit pattern is performed with respect to the wafer W, normally the above described gas replacement operation is not performed. However, in order to maintain low concentration of light-absorbing substances (or contaminants) in the gas in the space within the housing, a gas having a low absorptivity is supplied to the space, and the gas purity maintaining operation for exhausting light-absorbing substances is performed at any time, separately from the gas replacement operation described above.

Moreover, in the above described embodiment, in each of the illumination optical system LO, the reticle chamber 21, the projection optical system P and the wafer chamber 22, the gas replacement is performed, however, gas replacement may be performed selectively for each part. That is to say, for example, the illumination optical system LO shown in FIG. 1 has in general a long extension of the optical path, and in many cases, chemical cleaning measures are applied sufficiently, compared to the reticle chamber 21 and the wafer chamber 22. Therefore, gas replacement and optical cleaning may be performed with emphasis on the projection optical system PL having the plurality of lens elements 39a to 39f, and the illumination optical system LO having the plurality of optical members 30 to 38.

Also in the above described embodiment, a low absorbent gas having little energy absorption of vacuum-ultraviolet light, such as nitrogen, helium or argon is used as the replacement gas. At the time of performing gas replacement, however, absorbent gas (such as oxygen) containing light-absorbing substances (for example oxygen molecules) or ozone substances, which temporarily absorb vacuum-ultraviolet light and generate ozone, may be supplied to the space in the housing. That is to say, by supplying such absorbent gas to the space in the housing before gas replacement, exposure light is irradiated onto both the light-absorbing substances remaining in the space in the housing before gas replacement, and the temporarily supplied substances for generating ozone or absorbent gas containing ozone substances. As a result, ozone reliably exists in the space at the time of optical cleaning of the optical members, and the contaminants adhered to the surface of the optical members are stably oxidation decomposed. At that time, by supplying the gas so that the absorbent gas is locally distributed in the vicinity of the optical members, optical cleaning is performed more efficiently, to make it easy to eliminate light-absorbing substances from the optical members. Temporary supply of such absorbent gas is particularly advantageous, when it is expected that the concentration of light-absorbing substances in the space in the housing is maintained relatively low, for example, at the time of regular maintenance or the like. Here, needless to say, after optical cleaning is performed, using the absorbent gas, the space in the housing is subjected to gas replacement with low absorbent gas.

Moreover, in the above described embodiment, after irradiating the exposure light IL of a predetermined pulse (for example, 106 pulses), the operation proceeds to the next gas replacement operation. However, the present invention is not limited thereto, and the timing for performing the optical cleaning operation and the gas replacement (gas supply and exhaust) operation can be implemented based on various conditions as described below.

For example, as shown in FIG. 3, a concentration measurement device 75 (gas concentration sensor or the like) for measuring the concentration of light-absorbing substances as impurities in the gas in the individual space may be installed in the vicinity of each exhaust port 73 in the space in the housing, and timing for the optical cleaning operation and the gas supply and exhaust operation may be determined, based on the measurement result of this concentration measurement device 75, under control of the main control unit 23. In this case, the position in which the concentration measurement device 75 is installed is not limited to the vicinity of each exhaust port 73 in the space in the housing, and the concentration measurement device 75 can be installed on a gas exhaust pipe which is connected to the housing.

In this case, for example, at the time of gas replacement, the concentration of light-absorbing substances in the gas in the space 53b on the light source side to be replaced with gas is monitored, and when the concentration of light-absorbing substances in the space 53b becomes equal to or below a predetermined value, the flow regulating mechanism 60 and the opening/shutting mechanism 61 are closed, to thereby stop the gas supply/exhaust operation with respect to the space 53b. Subsequently, with respect to the next space 53c in the traveling direction of the exposure light IL, the concentration of light-absorbing substances is monitored by the concentration measurement device 75, and gas replacement is performed.

As described above, gas replacement is performed along the traveling direction of the exposure light IL, while monitoring the concentration of light-absorbing substances by the concentration measurement device 75, so that even in the case where the concentration of light-absorbing substances before gas replacement is quite different for each space, the gas consumed at the time of gas replacement of one space and the wastage of required time is minimal. As a result, the concentration of light-absorbing substances in each space can be reduced reliably and efficiently.

Instead of the concentration measurement device 75, an optical information measuring device for measuring optical information of the exposure light IL having passed through the space in the housing may be installed at an optional position on the optical path. The optical information to be measured includes transmittance and reflectivity of the optical members, and energy amount and strength of light. In this case, since it is directly judged by this measuring device that the optical members are optically cleaned sufficiently, it is possible to ensure that the exposure light IL reaches the wafer W. It is a matter of course that the concentration of light-absorbing substances in the space in the housing and the contaminated state on the surface of the optical members may be controlled, by using these two measuring devices (concentration measurement device and optical information measuring device) in combination (for example, optical information is monitored by an illumination sensor or the like as the optical information measuring device provided on the wafer stage WST (see FIG. 1), only when the lowermost space in the traveling direction of the exposure light IL is subjected to gas replacement).

Moreover, rather than performing gas replacement sequentially in the traveling direction of the exposure light IL, the space in the housing to be replaced with gas is selected, based on the measurement result of the above described measuring device, and only the selected space may be subjected to gas replacement. For example, the space in the housing exceeding a tolerance is selected as an object of the gas supply and exhaust operation, from the measurement result of the above described measuring device, and the selected space is subjected to gas replacement, so that a low concentration of light-absorbing substances in the gas in the space in the housing can be maintained at a fast speed of response. Also, at the time of the actual exposure operation, the measurement value is monitored all the time, and when the measurement value exceeds a tolerance, the actual exposure operation may be stopped to automatically take measures for reducing the light-absorbing substances by the gas replacement operation. Furthermore, the concentration of light-absorbing substances, nonuniformity of the concentration, or history regarding the optical information of the exposure light is stored, and when the concentration or nonuniformity thereof is expected to exceed the tolerance, or before that event, the above described reduction measures may be executed. When a plurality of gas exhaust ports are provided for one space, a concentration measurement device may be installed respectively in the vicinity of each exhaust port, and when the concentration exceeds the tolerance at a specific measurement position, the exhaust port located in the vicinity of the measurement position is automatically open to exhaust gas, thereby suppressing a local increase in the concentration of light-absorbing substances.

Next, a second embodiment of the present invention will be described, with reference to FIG. 4A and FIG. 4B.

Figure 4A:
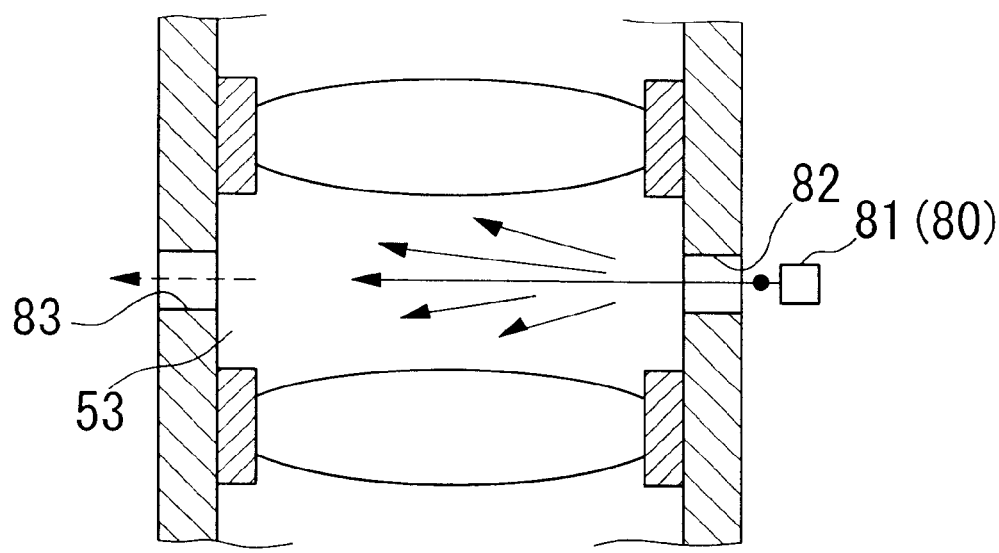
FIG. 4A is a sectional view of a housing, showing a schema of an embodiment of an optical instrument according to the present invention.

The different point between the second embodiment and the first embodiment is that the gas replacement apparatus 54 in the first embodiment comprises the gas supply device 55 and the gas exhaust device 56 described above, but a gas replacement apparatus 80 in the second embodiment comprises a gas supply device 81 for supplying a predetermined gas to each space 53 in a jet, as shown in FIG. 4A.

That is to say, in this embodiment, the opening space of a supply port 82 and the capability of the gas supply device 81 are determined so as to supply gas to the space 53 at a certain speed or higher from the supply port 82 arranged in the housing. Due to this construction, when replacement gas is supplied to the space 53 in the housing by the gas supply device 81, the gas flows into the space 53 from the supply port 82 in a jet (with the speed of the gas flowing into the space from the supply port 82 being larger than that of the gas in the piping up to the supply port 82). At this time, the gas in the space 53 is stirred, while the gas easily flows from the supply port 82 to distant locations.

If it is assumed that the exhaust port 83 is in an opened state, gas in the space 53 is exhausted from the exhaust port 83 in substantially the same amount as that of the gas flowing into from the supply port 82. In this case, when time t has passed since supply of the replacement gas was started, the concentration p(t) of light-absorbing substances in the gas in the space 53 is expressed as follows:

$$\rho(t) = \rho_0 \times \exp\left[-U/V_0 \times t\right] \quad (1)$$

wherein $\rho_0$ is the concentration of light-absorbing substances in the gas in the space 53 at a point of time when gas supply has been started, U is an inlet velocity of the replacement gas, and $V_0$ is a volume of the space to be replaced. From this equation (1), for example, the time until the concentration of light-absorbing substances in the space 53 becomes a predetermined value or below is determined, and gas is supplied to the space 53 based on that time, so that the gas in the space 53 is sufficiently replaced.

As described above, in this embodiment, gas is supplied to the space 53 in a jet by the gas supply device 81. As a result, the gas in this space 53 is stirred, local stagnation of light-absorbing substances is suppressed, and nonuniform concentration of light-absorbing substances in the gas in the space 53 can be reduced efficiently.

Figure 4B:
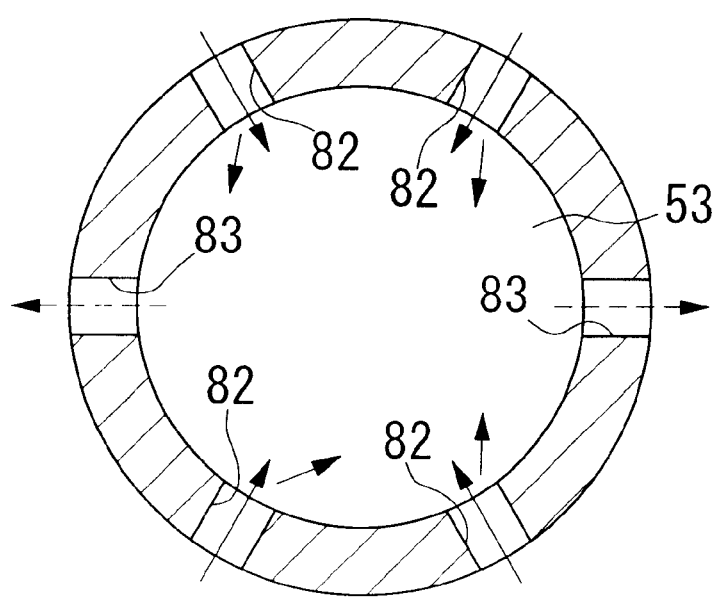
FIG. 4B is a sectional view of a housing, showing a schema of an embodiment of an optical instrument according to the present invention.
Figure 5:
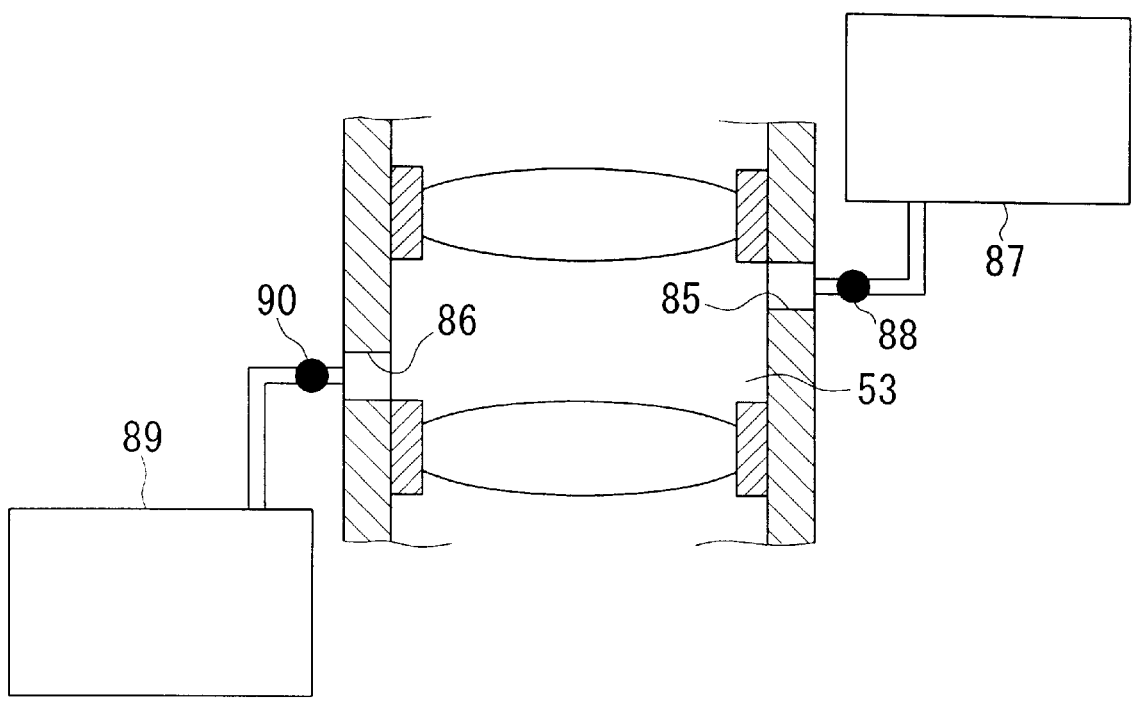
FIG. 5 is a sectional view of a housing, showing a schema of an embodiment of an optical instrument according to the present invention.

In this case, as shown in FIG. 4B, by providing a plurality of supply ports 82 and exhaust ports 83 for one space 53, the stirring effect in the space in the housing is further improved, and gas replacement is performed within a short period of time.

Moreover, a stirring apparatus having a nozzle or the like for diffusing the gas may be installed in the vicinity of the supply port 82, so that the inside of the space 53 can be stirred more reliably.

A third embodiment of the present invention will be described with reference to FIG. 5 and FIGS. 6A to 6C.

With the third embodiment, different from the first and second embodiments, a gas supply port 85 and a gas exhaust port 86 are arranged, by changing their height.

That is to say, in this embodiment, for example, the gas supply port 85 as an opening provided in the housing is arranged so as to open the upper part of the space 53 in the housing, and the exhaust port 86 is arranged so as to open the bottom part of the space 53 in the housing. Also, the supply port 85 is connected to a gas container 87, as a gas supply device in which the replacement gas is stored at a pressure about the same as that in the space 53 in the housing, via a valve 88, and the exhaust port 86 is connected to a gas exhaust device 89 such as a vacuum pump via a valve 90.

If these valves 88 and 90 are opened, and gas is exhausted from the space 53 in the housing by the gas exhaust device 89, the replacement gas substantially in the same amount as that of the exhausted gas flows into the space 53 in the housing. Here, it is assumed that the specific gravity of the replacement gas is lighter than that of the gas in the space 53 before replacement (gas to be replaced). At this time, most of the replacement gas exists in the upper part of the space 53 in the housing, and most of the gas to be replaced exists in the lower part thereof, due to the difference of specific gravity between the gas to be replaced and the replacement gas. As the replacement gas is filled gradually into the housing from the upper part thereof, gas containing the gas to be replaced in a larger amount is exhausted from the exhaust port 86 at the bottom part of the housing, to thereby effect gas replacement. At this time, gas containing the gas to be replaced in a larger amount is exhausted mainly from the exhaust port 86, and hence the replacement gas consumed at the time of gas replacement is hardly wasted. Moreover, local stagnation of the gas to be replaced (light-absorbing substances) hardly occurs, and the concentration nonuniformity of the light-absorbing substances can be easily reduced.

Figure 6A:
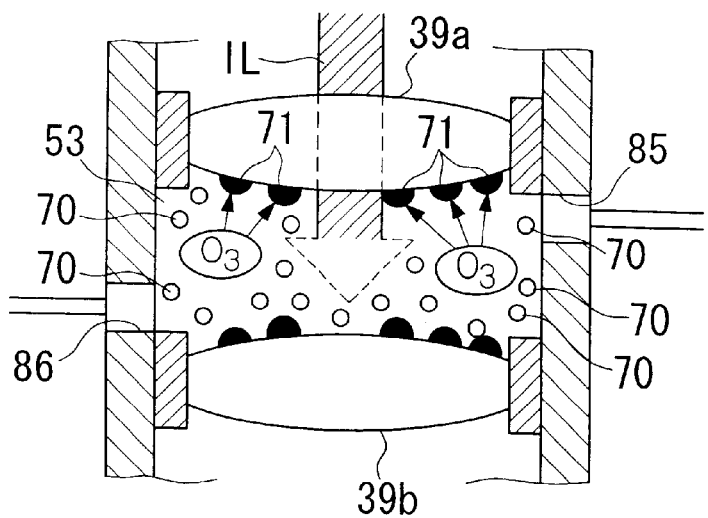
FIG. 6A is a diagram for explaining a gas replacement method using a difference of specific gravity.
Figure 6B:
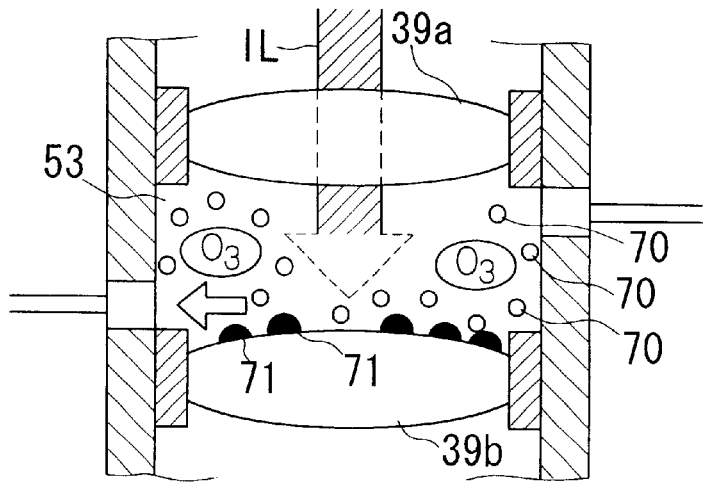
FIG. 6B is a diagram for explaining a gas replacement method using a difference of specific gravity.
Figure 6C:
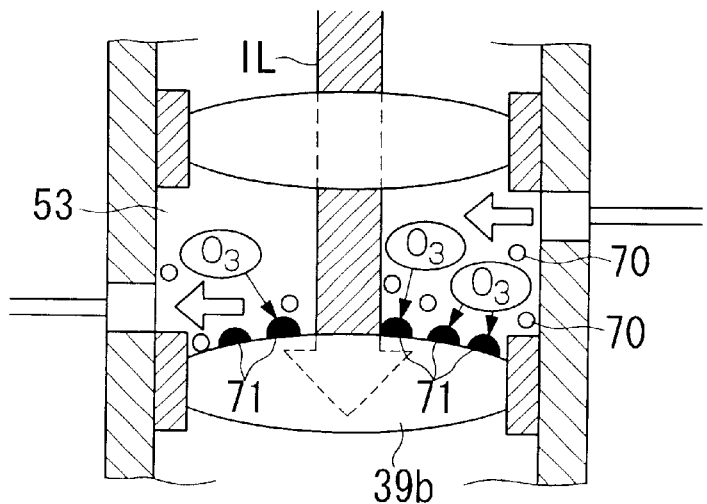
FIG. 6C is a diagram for explaining a gas replacement method using a difference of specific gravity.

In the above described embodiment, the gas is absorbed by using the gas exhaust device 89, however, the gas may be replaced by supplying gas from the supply port 85 side and forcing the gas out due to the difference of specific gravity. In either case, it is preferred that the drift velocity of the gas at the time of gas supply/exhaust is made small, so that the gas to be replaced and the replacement gas are mixed as little as possible, and so that the flow rate of the gas per unit time is increased as much as possible, in order to replace the gas within a short period of time. For that purpose, it can be considered to provide a plurality of supply ports and exhaust ports for one space, or to determine the direction of the supply ports and exhaust ports so that the gas flows in a spiral form. Also, in the case where the specific gravity of the replacement gas is heavier than that of the gas to be replaced, on the contrary to the example shown in FIG. 5, the supply port is disposed at the bottom part and the exhaust port is disposed at the upper part. Moreover, this embodiment is preferably used for a case where the gas absorptivity of the gas in the space in the housing is quite high, as shown in FIG. 6A. In FIGS. 6A to 6C, it is assumed that the specific gravity of the replacement gas is lighter than the gas to be replaced, and the supply port 85 is arranged on the light source side (at the upper part herein), and the exhaust port 86 is arranged on the side opposite to the light source (at the lower part).

That is to say, as shown in FIG. 6A, in the case where the gas in the space 53 in the housing is apt to absorb the exposure light IL, and the exposure light IL is attenuated in one space 53 in the housing on the optical path, ozone is generated only in the area where the exposure light IL reaches. Therefore, contaminants 71 adhered to the surface are oxidation decomposed, for the optical member (lens element) 39a located on the light source side. However, for the optical member 39c located on the downstream side, since ozone is little, the contaminants 71 adhered to the surface are hardly oxidation decomposed.

At this time, if the non-absorbent replacement gas is made to flow into the space 53 in the housing from the supply port 85 located at a high position, the replacement gas stagnates in the upper part (on the light source side) of the space 53 due to the difference of specific gravity.

In the area of the space 53 filled with the replacement gas, since the exposure light IL passes with practically no attenuation, then as shown in FIG. 6B, as the replacement gas is gradually filled into the space 53, the ozone generation location moves downwards, that is, along the traveling direction of the exposure light IL. Then, when the exposure light IL reaches the bottom of the space 53, as shown in FIG. 6C, contaminants 71 adhered to the surface of the optical members 39b located on the downstream side are oxidation decomposed due to the ozone.

That is to say, even in the case where light energy is immediately absorbed by the gas in the space 53 in the housing, by arranging the supply port 85 and the exhaust port 86, changing their height, and performing gas replacement, utilizing the difference of specific gravity, while irradiating the exposure light IL, the area where the exposure light IL reaches is shifted, and hence optical cleaning can be also performed effectively with respect to the surface of the optical member located on the downstream side far from the optical path. It is a matter of course that a similar effect can be obtained by adequately determining the arrangement position of the supply port and the exhaust port, even in the case where the traveling direction of the exposure light IL is upward or horizontal, or the specific gravity of the replacement gas is heavier than that of the gas to be replaced.

A fourth embodiment of the present invention will now be described, with reference to FIGS. 7A, 7B and FIGS. 8A, 8B.

The different point between the fourth embodiment and the first embodiment is that, in the first embodiment, the gas replacement apparatus 54 is constructed so that the gas is made to flow by means of the gas supply device 55 and the gas exhaust device 56 to thereby replace the gas, whereas the gas replacement apparatus in the fourth embodiment temporarily changes the volume of the space in the housing by a volume variable member, to thereby replace the gas.

Figure 7A:
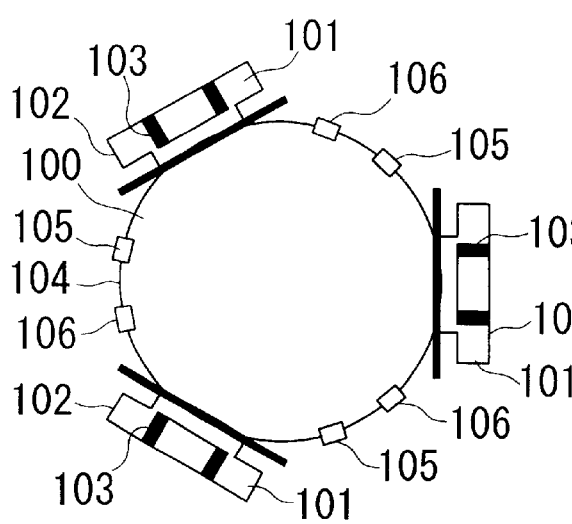
FIG. 7A is a sectional view of a housing, showing a schema of an embodiment of an optical instrument according to the present invention.
Figure 7B:
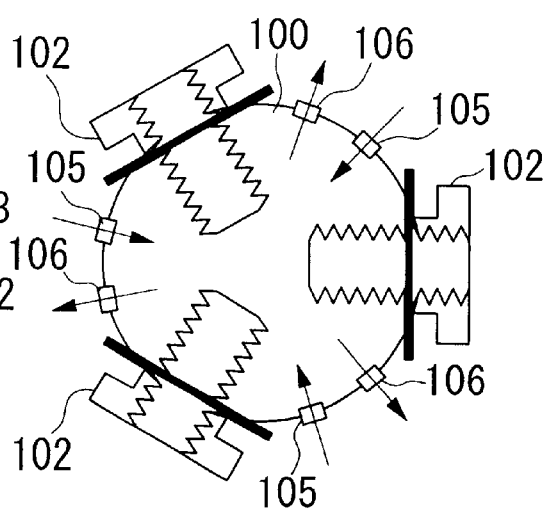
FIG. 7B is a sectional view of a housing, showing a schema of an embodiment of an optical instrument according to the present invention.
Figure 8A:
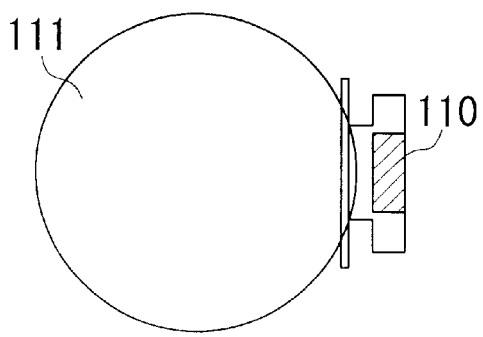
FIG. 8A is a sectional view of a housing, showing an example using a balloon shaped member as a volume variable member shown in FIG. 7.
Figure 8B:
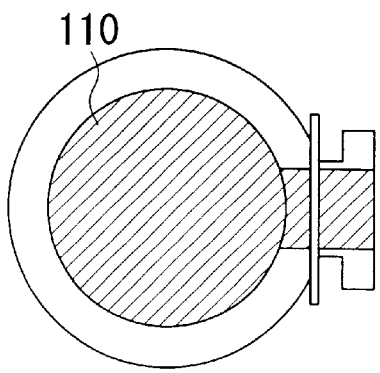
FIG. 8B is a sectional view of a housing showing an example using a balloon shaped member as a volume variable member shown in FIG. 7.

Specifically, for example, as shown in FIGS. 7A and 7B, this gas replacement apparatus comprises; a storage section 102 having an internal space 101 linked to a space 100 in the housing, a bellows member 103 as a retractable volume variable member stored in the internal space 101 of this storage section 102, and a drive section (not shown) for expanding and contracting this bellows member 103. The housing 104 is also provided with a supply port 105 freely openable for supplying the gas, and an exhaust port 106 freely openable for exhausting the gas, which are connected to a gas supply source and a gas exhaust space (not shown), respectively, via piping or the like. Moreover, one or more bellows members 103 are provided depending on the volume of the space 100 in the housing, and the bellows member 103 and the housing 104 are connected to each other in a gastight manner. When gas replacement is not performed, this gas replacement apparatus is in a state as shown in FIG. 7A, with the supply port 105 and the exhaust port 106 closed, and the bellows member 103 stored in the storage section 102.

With this construction, in this embodiment, at the time of gas replacement, the supply port 105 is closed, and the exhaust port 106 is opened, and as shown in FIG. 7B, the bellows member 103 is expanded into the space 100 in the housing by means of the drive section. With this expansion, since the volume in the space 100 decreases, gas in an amount corresponding to this decrease is exhausted from the exhaust port 106. On the contrary, when the supply port 105 is opened, the exhaust port 106 is closed, and the bellows member 103 is contracted and stored in the storage section 102 by the drive section, the volume of the space 100 increases, and gas in an amount corresponding to this increase flows into the space 100 from the supply port 104.

By repeating expansion and contraction of the bellows member 103, the inside of the space 100 is replaced with replacement gas. Here, if it is assumed that the space is filled with light-absorbing substances to 100% before gas replacement, it is theoretically confirmed that the concentration of light-absorbing substances in the space 100 in the housing is reduced up to 1 ppm or less, by repeating the above described expansion and contraction operation about 20 times, when the volume change of the space 100 with the expansion and contraction of the bellows member 103 is 50%, and about 10 times when the volume change of the space 100 is 75%.

In this embodiment, since gas replacement is performed by changing the volume of the space 100 in the housing, using the retractable bellows member 103, there are advantages described below, compared to the first embodiment (and the third embodiment).

In the first embodiment, at the time of gas replacement, replacement gas is continuously supplied. On the other hand, in this embodiment, replacement gas is supplied intermittently only at the time of contraction of the bellows member 103, and hence the gas consumption is small. Also, in this embodiment, at the time of the expansion and contraction operation of the bellows member 103, the volume in the space 100 in the housing changes considerably, and hence, gas flow occurs in almost all areas in the space 100, and local stagnation of light-absorbing substances hardly occurs. As a result, the concentration of light-absorbing substances in the space 100 is easily made uniform. Moreover, in the case where gas replacement is performed using the difference of specific gravity as in the third embodiment, if the temperature of the gas in the space or the temperature of the replacement gas is high, gas is mixed due to the hot molecule movement, and there is a possibility that gas replacement may not be performed effectively. On the other hand, in this embodiment, there is no such possibility.

The volume variable member shown in this embodiment is preferably formed of a material which is unlikely to cause outgassing of contaminants (for example, a fluorine type polymer), since the external surface of the volume variable member comes in contact with the gas in the space in the housing.

Furthermore, the volume variable member for changing the volume of the space 100 in the housing is not limited to the above described bellows member 103, and for example, as shown in FIG. 8, an expandable and contractible balloon shaped member 110 comprising a thin resilient film may be used. In this case, since the shape of the balloon shaped member 110 at the time of expansion changes depending on the shape of the space 111 in the housing, a rate of volume change in one expansion is larger than that in the case of the above described bellows member 103, and the number of times of expanding the balloon shaped member 110 (number of drives of the drive section) decreases.

Next, a fifth embodiment of the present invention will be described with reference to FIG. 9.

Figure 9:
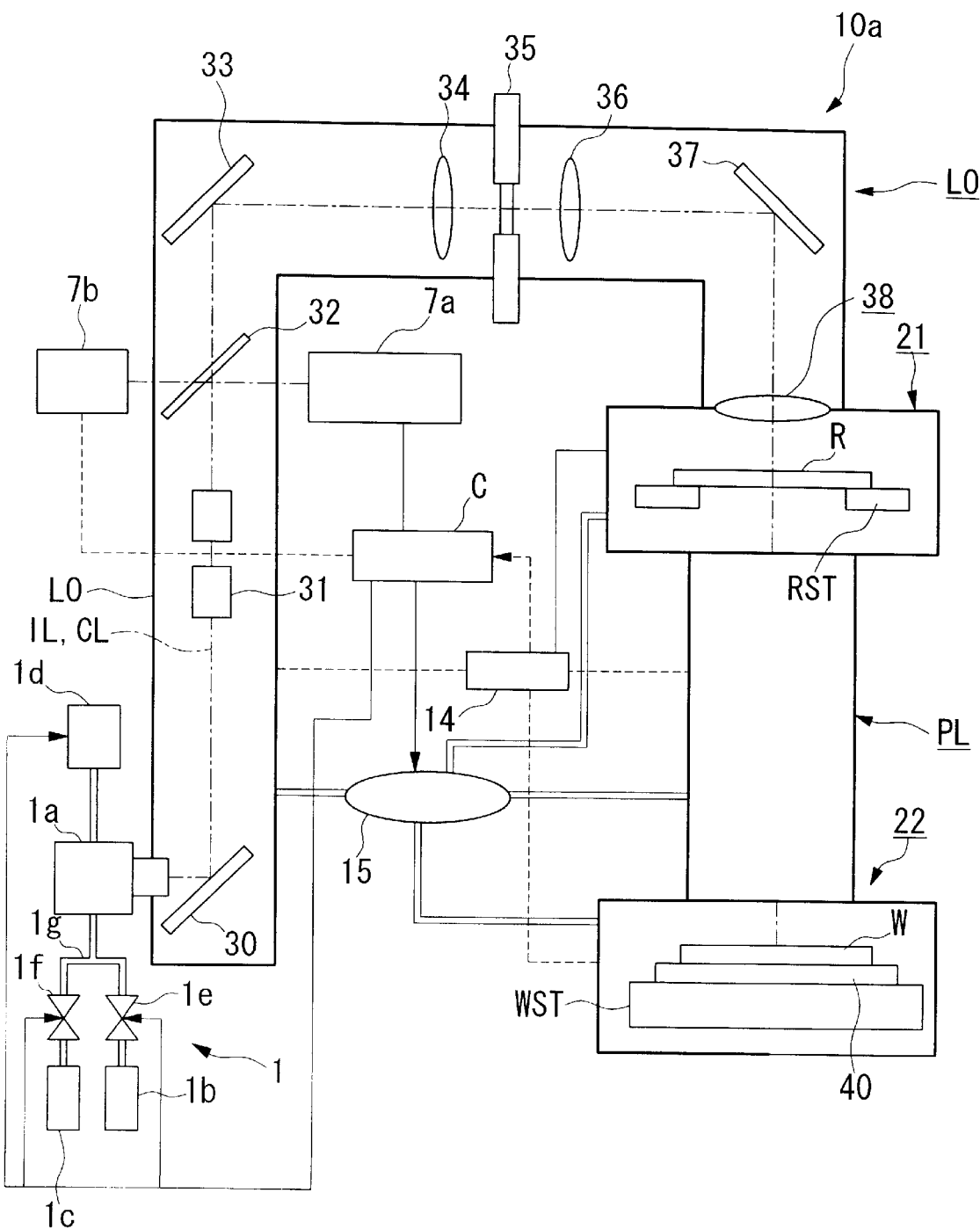
FIG. 9 is a diagram showing a schematic construction of an example of an exposure apparatus according to the present invention.

FIG. 9 is a diagram schematically showing the overall construction of an exposure apparatus 10a in this embodiment. This exposure apparatus 10a is a projection exposure apparatus for manufacturing semiconductor devices of a step-and-scan method, having an $F_2$ laser emitting the exposure light IL of vacuum-ultraviolet light (wavelength: 157 nm) (light having a first wavelength). In FIG. 9, the same parts having the same construction as in FIG. 1 are denoted by the same reference symbols as in FIG. 1, and their explanation is omitted.

This exposure apparatus 10a comprises an integrator sensor 7a for receiving the exposure light IL which is illuminated by a beam splitter 32 and monitoring an energy obtained by the exposure, and a reflectivity monitor 7b for receiving the exposure light IL which is returned from the wafer W or a plurality of optical members positioned between the beam splitter 32 and the wafer W through the bean splitter 32 after transmitting the beam splitter 32. In this exposure apparatus 10a, the integral luminous intensity and reflectivity of exposure light of a light source 1 is measured and monitored by the integrator sensor 7a and the reflectivity monitor 7b, which transmit the measurement value to a control system C, so that the illuminance at the time of printing of the wafer W is known.

Moreover, the illumination optical system LO, the reticle chamber 21, the projection optical system PL and the wafer chamber 22 are connected to a concentration measurement device 14 for measuring the concentration (purge purity) of light-absorbing substances in these spaces on the optical path, and the measurement value is transmitted as a signal to the control system C. The above four sections may be controlled to have a concentration of light-absorbing substances different from each other, according to the optical path length and disturbance frequency.

Furthermore, a vacuum pump 15 for sucking the internal gas is connected to the illumination optical system LO, the reticle chamber 21, the projection optical system PL and the wafer chamber 22, and this vacuum pump 15 is controlled by the control system C. Also, a gas supply mechanism (not shown) for supplying a purge gas having a small absorptivity (for example, nitrogen, helium, argon or the like) to an internal lens chamber is connected to the illumination optical system LO and the projection optical system PL. That is to say, in order to reduce or eliminate light-absorbing substances from the inside of each section described above, purge gas having a low absorptivity (having high cleanliness) is made to flow in, and pressure is reduced, by the gas supply mechanism and the vacuum pump 15. As required, a difference of air pressure with the outside may be removed by making non-light absorbing substances flow in. In this case, it is not necessary for each section in the exposure apparatus to have a redundant structure with a strength more than necessary. It is also possible to reduce or eliminate light-absorbing substances from the inside of each section described above, by letting a purge gas having high purity and low absorptivity flow in, without using a vacuum pump, and exhausting the mixed gas.

The light source 1 comprises: a laser resonator ($F_2$ laser beam source, ArF laser beam source) 1a for generating exposure light IL or cleaning light (light having a second wavelength) CL by the filled gas; an $F_2$ gas supply source 1b for filling a fluorine gas and a buffer gas (helium, neon, or the like) in the laser resonator 1a in an adequate amount; an ArF gas supply source 1c for filling a fluorine gas, an argon gas and a buffer gas in the laser resonator 1a in an adequate amount; and a vacuum pump 1d for sucking the gas in the laser resonator 1a and exhausting the gas.

Moreover, the $F_2$ gas supply source 1b and the ArF gas supply source 1c are connected to the laser resonator 1a by a supply pipe 1g via an $F_2$ side valve 1e and an ArF side valve 1f. Also, the vacuum pump 1d, the $F_2$ side valve 1e and the ArF side valve 1f are respectively connected to a control system C and controlled. That is to say, an optional gas can be supplied to the laser resonator 1a from either of the $F_2$ gas supply source 1b or the ArF gas supply source 1c, by opening only one of the $F_2$ side valve 1e or the ArF side valve 1f, in response to a command from the control system C.

The laser resonator 1a itself has the same structure as that of a normal vacuum-ultraviolet light source, except for being capable of replacing the filler gas. Normally, a laser resonator emitting vacuum-ultraviolet light has a slightly different specification, such that a higher voltage should be applied compared to one emitting a laser beam having a longer wavelength. However, it is easy to generate an ultraviolet laser beam having a longer wavelength, using a laser resonator emitting vacuum-ultraviolet light, and in most cases, remodeling is not necessary. Accordingly, there is practically no cost increase due to the formation of the light source 1.

Next, an exposure apparatus and a cleaning method for optical members, in this embodiment will be described.

At first, the ArF side valve if is opened and the $F_2$ side valve 1e is closed by the control system C, and the fluorine gas ($F_2$), argon gas (Ar) and buffer gas (He or Ne) are filled into the laser resonator 1a in an adequate amount from the ArF gas supply source 1c. Here, as the gas composition in this embodiment, for example, $F_2$ is set to be 0.1%, Ar to 1%, and He or Ne to 98.9%.

After filling the gas, an adequate voltage is applied to the laser resonator 1a to discharge electricity, to excite the gas, so that an ArF excimer laser beam (wavelength: 193 nm) is oscillated as the cleaning light CL. This cleaning light CL is ultraviolet light having a longer wavelength than that of the exposure light IL. Then, this cleaning light CL is made to shine onto a deflection mirror 30 to be irradiated to each optical member in the illumination optical system LO and the projection optical system PL. Here, it is more efficient if oxygen molecules are made to exist beforehand in the space on the optical path in the illumination optical system LO and the projection optical system PL.

An advantage of using the ArF laser in addition to the $F_2$ laser as the cleaning light CL is that the ArF laser has a higher formation rate of ozone than the $F_2$ laser. Also, even if air containing oxygen and water molecules remains in the space on the optical path, the ArF laser can transmit through the space on the optical path. On the other hand, if air containing oxygen and water molecules remains in the space on the optical path, the $F_2$ laser is absorbed by the oxygen and water molecules and cannot transmit through the space on the optical path.

Therefore, if there is residual air in the space on the optical path, the ArF laser can perform optical cleaning with respect to the optical members on the wafer W side (space in the optical path away from the light source). On the other hand, the $F_2$ laser can only perform optical cleaning with respect to the optical members on the light source 1 side (space in the optical path close to the light source 1). That is to say, since the $F_2$ laser cannot transmit through the oxygen and water molecules contained in the air, as described above, the $F_2$ laser does not reach the optical members on the wafer W side, and optical cleaning cannot be performed.

Moreover, in the case of the $F_2$ laser, if substances adhere to the surface of the optical member, the absorptivity for absortion by the substances is higher than that for the ArF laser. As a result, the $F_2$ laser does not reach the optical members on the wafer side. Therefore, comparing the cleaning state between a space away from the light source and a space close to the light source, the ArF light shows higher efficiency of optical cleaning than the $F_2$ laser.

At this time, the surface of the optical members irradiated with the ArF excimer laser beam having high formation efficiency of ozone due to a reaction with oxygen is optically cleaned, and contaminants adhered thereon are eliminated, to reduce "clouding" of the optical members. That is to say, organic matter in the contaminants adhered to the surface of the optical members is dissolved by the laser energy, and the contaminants are reduced due to oxidation behavior by ozone generated by the photochemical reaction of oxygen. Here, as each optical member in the illumination optical system LO and the projection optical system PL, deflection mirrors 30, 33, 37, a fly-eye lens 31, a transmission mirror 32, relay lenses 34, 36, a condenser lens 38 and a plurality of lenses in the projection optical system PL are cleaned. Also, by irradiating the cleaning light CL at about 106 pulses, the optical members are sufficiently cleaned.

Moreover, inside of the reticle chamber 21 may be kept as a chamber where oxygen molecules exist, and irradiation by the above described cleaning light CL is performed, with the reticle R (including a thin pellicle and quartz glass) set on the reticle stage RST, to thereby optically clean the reticle R similarly.

Next, while the gas in the illumination optical system LO, the reticle chamber 21 and the projection optical system PL is sucked by the vacuum pump 15 with the control system C, a high-purity purge gas is made to flow, to thereby eliminate the gas in the space on the optical path. This is because since substances such as water molecules ($H_2O$) and carbon dioxide molecules ($CO_2$) generated at the time of optical cleaning become light-absorbing substances with respect to the vacuum-ultraviolet light, being the exposure light IL, it is necessary to eliminate these substances from the space on the optical path before the exposure. This processing makes it possible to transfer a circuit pattern with a sufficient quantity of light of the exposure light IL and with illuminance uniformity.

After completion of the above operation, the gas filled in the laser resonator 1a is sucked by the vacuum pump 1d under control of the control system C, to thereby exhaust or recover the gas. Here, preparation time until the exposure start time can be reduced, by performing the operation of eliminating light-absorbing substances in the space on the optical path and the operation of replacing the gas in the laser resonator. Furthermore, the $F_2$ side valve 1e is opened and the ArF side valve 1f is closed by the control system C, and the fluorine gas ($F_2$) and buffer gas (He) are filled into the laser resonator 1a in an adequate amount from the $F_2$ gas supply source 1b. As the gas composition in this embodiment, for example, $F_2$ is set to be 0.1% and He is set to be 99.9%.

After filling the gas, an adequate voltage is applied to the laser resonator 1a to discharge electricity, to excite the gas, so that an $F_2$ laser beam (wavelength: 157 nm) is oscillated as the exposure light IL. Then, a pattern on the reticle R is transferred onto the wafer W by this exposure light IL, via the projection optical system PL.

Handling of the apparatus can be increased, by incorporating a system which monitors the quantity of exposure light all the time with an integrator sensor 7a and a reflectivity monitor 7b, and when the quantity of exposure light becomes a predetermined value or below, automatically interrupts the transfer of the circuit pattern by the control system C, and performs the above described steps for reducing "clouding". In this case, needless to say, it is necessary to suspend exposure of the circuit pattern until the clouding of the optical member becomes a predetermined value or below. Also, at the time of not performing exposure, an actinometer may be installed at a position corresponding to the wafer, according to need, and the quantity of exposure light may be monitored.

In this embodiment, it is possible to eliminate contaminants adhered to the surface of optical members before transfer, and remove "clouding" at the same time and easily, by irradiating the cleaning light CL, which is ultraviolet light (ArF excimer laser beam) having a longer wavelength than that of the exposure light IL, onto the optical members arranged in the optical path of the exposure light IL (illumination optical system LO, the reticle chamber 21, and the projection optical system PL), being the vacuum-ultraviolet light ($F_2$ laser beam), and optically cleaning the optical members with the cleaning light CL having a high ozone generation efficiency. As a result, sufficient illuminance by means of the $F_2$ laser beam can be secured.

Moreover, since the light source 1 has the ArF gas supply source 1c, the ArF side valve 1f and the supply pipe 1g, as the gas replacement mechanism for replacing the gas filled into the laser resonator 1a generating the $F_2$ laser beam with the gas generating the ArF excimer laser beam, the exposure light IL and the cleaning light CL can be generated by the same laser resonator 1a, with a simple construction and at a low cost.

Furthermore, the present invention includes the following embodiments.

In the above embodiment, by using one light source 1 which can optionally generate the $F_2$ laser beam having a wavelength of 157 nm and the ArF excimer laser beam having a wavelength of 193 nm, the exposure light IL and the cleaning light CL are obtained with a simple structure. However, the optical system may be formed such that a light source for the exposure light IL and a light source for the cleaning light are separately provided, and either one of the light sources is optionally selected, so that the laser beam from this light source is shone onto the deflection mirror 30.

Moreover, in the above embodiment, the gas in the spaces in the projection optical system PL and the illumination optical system LO is sucked by the vacuum pump 15, however, for example, a cryopump may be used. The cryopump is a kind of vacuum pump, being a type which cools a solvent such as activated carbon, synthesized calcium fluoride with a refrigerant such as nitrogen, and a surface (cryopanel) cooled to a very low temperature (10 to 15K) is placed in a vacuum, and this surface adsorbs gas (gases other than $H_2$, He and Ne, for example, $N_2$, Ar), to thereby create a high vacuum.

Furthermore, in the above embodiment, nitrogen gas, helium or argon are used as the purge gas to be supplied to the spaces in the projection optical system PL and the illumination optical system LO, however, a gas such as neon, krypton, xenon or radon may be used.

The exposure apparatus in the above embodiment can be applied to a proximity exposure apparatus adapted to expose the pattern of the mask by bringing the mask and the substrate into tight contact with each other without using the projection optical system.

For the application of the exposure apparatus, this is not limited to exposure apparatus for manufacturing semiconductors, and can also be widely applied to exposure apparatus for manufacturing other devices, for example, exposure apparatus for manufacturing liquid crystals for exposing a pattern of a liquid crystal display device on a rectangular glass plate, or an exposure apparatus for manufacturing thin-film magnetic heads.

In this embodiment, the light source for exposure light in the exposure apparatus may be a light source for not only the F₂ laser (157 nm), but also other vacuum-ultraviolet light lasers, and may be a light source having a shorter wavelength than that of the $F_2$ laser. Also, the light source for the cleaning light may be not only the ArF excimer laser (193 nm), but also an ultraviolet light laser beam source having a longer wavelength than that of the vacuum-ultraviolet light laser of the exposure light.

The magnification of the projection optical system may involve a reduction system, an equal magnification or an enlarging system. As the projection optical system, a cata-refracting system or a refracting optical system is used.

The exposure apparatus in this embodiment is also applicable to exposure apparatus of the step-and-repeat method wherein a pattern of a mask is exposed, with the mask and the substrate stopped, and the substrate is sequentially moved step by step.

When a linear motor is used for the wafer stage or the reticle stage, either one of an air floating type using an air bearing or a magnetic floating type using Lorentz's force or a reactance force may be used. Each of the stages may be a type moved along a guide, or may be a guideless type having no guides.

When a flat motor is used as a driving device of the stage, either one of a magnet unit (permanent magnet) or an armature unit may be connected to the stage, and the other of the magnet unit or the armature unit may be provided at the moving surface side (base) of the stage.

As described in Japanese Unexamined Patent Application, First Publication No. Hei 8-166475, the reaction force generated by the movement of the wafer stage may be mechanically dissipated to the floor (ground) by using a frame member. The present invention can be applied to exposure apparatus having such a structure.

As described in Japanese Unexamined Patent Application, First Publication No. Hei 8-330224, the reaction force generated by the movement of the reticle stage may be mechanically dissipated to the floor (ground) by using a frame member. The present invention can be applied to exposure apparatus having such a structure.

As described above, the exposure apparatus of the present invention is manufactured by assembling various subsystems including components described in the appended claims in such a way as to maintain specified mechanical accuracy, electric accuracy and optical accuracy. To secure such accuracy, before/after the assembling of the components, various optical systems are adjusted to achieve optical accuracy; various mechanical systems are adjusted to achieve mechanical accuracy; and various electric systems are adjusted to achieve electric accuracy. The process of assembling the exposure apparatus by various sub-systems includes, among various sub-systems, mechanical connection, wiring connection among the electric circuits, piping connections among pressure circuits, and so on. Needless to say, the process of assembling each sub-system is executed before this process of assembling the exposure apparatus by the various sub-systems. After the end of the process of assembling the exposure apparatus by the various sub-systems, an overall adjustment is carried out to secure the various types of accuracy for the entire exposure apparatus. Preferably, the exposure apparatus should be manufactured in a clean room having a controlled temperature, level of cleanliness, and so on.

Figure 10:
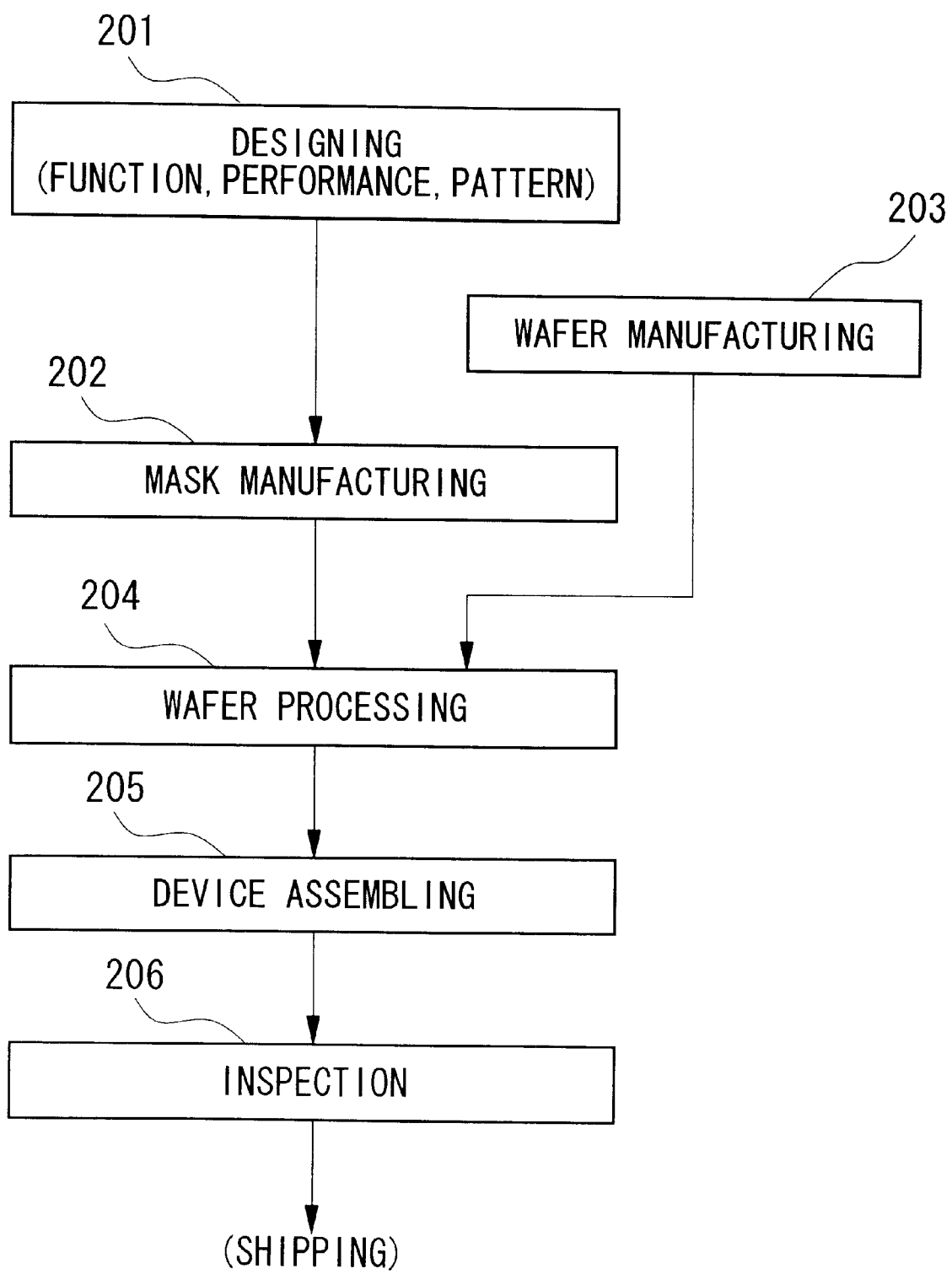
FIG. 10 is a flowchart showing one example of a manufacturing process of semiconductor devices.

A semiconductor device is, as shown in FIG. 10, manufactured through a step 201 for designing the function, performance or pattern of the device, a step 202 for manufacturing a mask (reticle) based on the result of the designing step, a step 203 for manufacturing a wafer from a silicon material, a wafer processing step 204 for exposing a pattern of the reticle onto the wafer by the exposure apparatus of the foregoing embodiment, a step 205 for assembling the device (including dicing, bonding and packaging processes), an inspection step 206, and so on.

What is claimed is:

1. An optical instrument comprising:
a gas replacement apparatus which is connected to a plurality of spaces which are located on an optical path of an energy beam, and replaces the gas in said plurality of spaces with a predetermined gas, sequentially along the traveling direction of the energy beam.

2. An optical instrument according to claim 1, further comprising:
a light source which emits said energy beam, and
a control unit which is connected to said light source and said gas replacement apparatus and controls said light source and said gas replacement apparatus, so that while said energy beam is emitted towards the space on said light source side, among the plurality of spaces, the gas in said plurality of spaces is replaced with the predetermined gas from the space on said light source side, sequentially along the traveling direction of said energy beam.

3. An optical instrument according to claim 1, wherein said gas replacement apparatus comprises a gas supply device which is connected to said plurality of spaces and supplies said predetermined gas to said plurality of spaces, respectively, and a gas exhaust device which is connected to said plurality of spaces and exhausts the gas in said spaces, respectively, from said plurality of spaces.

4. An optical instrument according to claim 3, wherein said predetermined gas supplied from said gas supply device contains ozone or substances which absorb said energy beam and generate ozone.

5. An optical instrument according to claim 3, wherein said gas supply device comprises a stirring device which stirs the gas in at least one of said plurality of spaces.

6. An optical instrument according to claim 3, wherein said gas replacement apparatus has a supply port which supplies said predetermined gas to each of said spaces and an exhaust port which exhausts said gas in each of said spaces, and said supply port and exhaust port are provided with each of said spaces, with their height changed from each other, so that the gas in each of said spaces is replaced due to a difference of specific gravity between said predetermined gas supplied to said space and the gas in said space.

7. An optical instrument according to claim 1, wherein said gas replacement apparatus has a supply port which supplies said predetermined gas to said space and an exhaust port which exhausts said gas in said space, and said supply port and exhaust port are provided with said space, with their height changed from each other, so that the gas in said space is replaced due to a difference of specific gravity between said predetermined gas supplied to said space and the gas in said space.

8. An optical instrument according to claim 1, wherein said control unit has at least one of a first measuring device in connection with said space and measures a concentration of impurities in the gas in said space, and a second measuring device in connection with said space and measures optical information of said energy beam having passed through said plurality of spaces, and the gas in said plurality of spaces is sequentially replaced, based on the measurement results of the first and second measuring devices.

9. An exposure apparatus comprising:
an illumination optical system which is located on an optical path of an energy beam and illuminates a mask having a pattern formed thereon with the energy beam, a projection optical system which is located on an optical path of the energy beam and transfers the pattern on said mask onto a substrate, and a gas replacement apparatus which is connected to a plurality of spaces which are formed in at least one of said illumination optical system and said projection optical system, and selectively replaces the gas in said plurality of spaces with a predetermined gas, sequentially along the traveling direction of the energy beam.

10. An exposure apparatus according to claim 9, further comprising:

a light source which emits said energy beam, and a control unit which is connected to said light source and said gas replacement apparatus and controls said light source and said gas replacement apparatus, so that while said energy beam is emitted towards the space on said light source side, among the plurality of spaces in said illumination optical system, the gas in said plurality of spaces is replaced with the predetermined gas from the space on said light source side, sequentially along the traveling direction of said energy beam.

11. An exposure apparatus according to claim 10, wherein the energy beam which illuminates said mask and the energy beam which is emitted towards said spaces are different beams.

12. An exposure apparatus according to claim 11, wherein the energy beam, which is emitted towards said spaces, has a wavelength longer than that of the energy beam which illuminates said mask.

13. An exposure apparatus according to claim 12, wherein the energy beam, which is emitted towards said spaces, is an ArF excimer laser beam, and the energy beam which illuminates said mask, is an $F_2$ laser beam.

14. An exposure apparatus according to claim 11, wherein the energy beam which is emitted towards said spaces and the energy beam which illuminates said mask are emitted from the same light source.

15. An exposure apparatus according to claim 11, wherein the energy beam which is emitted towards said spaces, illuminates at least one of optical members which form said illumination optical system and said projection optical system, to thereby optically clean said optical member.

16. A manufacturing method for devices according to claim 11, wherein at the time of said optical cleaning step, the gas filled in a laser resonator is replaced with a gas which generates said light having the second wavelength, and after having completed optical cleaning of said optical member, the gas filled in said laser resonator is changed from the gas which generates said light having the second wavelength to the gas which generates said light having the first wavelength.

17. An exposure apparatus comprising:

an optical member which is located on an optical path of light having a first wavelength beam and illuminates said light having the first wavelength onto a substrate through a mask having a pattern formed thereon, and an optical cleaning mechanism in connection with said optical member and which illuminates light having a second wavelength longer than said light having the first wavelength, onto said optical member.

18. An exposure apparatus according to claim 17, wherein said optical cleaning mechanism having a gas replacing mechanism which replaces the gas which is filled in a laser resonator for generating said light having the first wavelength to the gas for generating said light having the second wavelength.

19. An exposure apparatus according to claim 17, further comprising an $F_2$ laser beam source for generating an $F_2$ laser beam as said light having the first wavelength, and an ArF excimer laser beam source for generating an ArF excimer laser beam as said light having the second wavelength.

20. An exposure method comprising the steps of:

replacing the gas in a first space along a traveling direction of an energy beam, of a plurality of spaces which are formed in an optical path of the energy beam, with a predetermined gas, optically cleaning an optical member in the first space by the energy beam while replacing the gas in the first space with the predetermined gas, replacing the gas in a second space of said plurality of spaces which is formed adjacent to the first space along a traveling direction of the energy beam, with a predetermined gas, after the optical cleaning of the optical member, and optically cleaning an optical member in the second space by the energy beam while replacing the gas in the second space with the predetermined gas.

21. An exposure method according to claim 20, wherein said a plurality of spaces are formed in at least one of an illumination optical system which illuminates a mask having a pattern formed thereon with the energy beam, or a projection optical system which transfers the pattern onto a substrate.

22. An exposure method according to claim 21, wherein said illumination optical system and projection optical system have a plurality of optical members, and said spaces are formed between said plurality of optical members.

23. An exposure method according to claim 22, wherein the gas in said spaces which are formed between said optical members are replaced with the predetermined gas, sequentially along the traveling direction of the energy beam.

24. An exposure method according to claim 21, wherein the energy beam which illuminates a mask having a pattern formed thereon has different wavelength of the energy beam for optical cleaning of the optical members.

25. An exposure method comprising the steps of:

irradiating light having a first wavelength onto a mask, and transferring a pattern on the mask onto a substrate under the light having the first wavelength, wherein before said transfer, optically cleaning an optical member with light having a second wavelength longer than said light having the first wavelength, said optical member located on the optical path of said light having the first wavelength.

26. An exposure method according to claim 25, wherein a gas filled in a laser resonator is replaced with a gas which generates a light having the second wavelength, to thereby generate said light having the second wavelength in said laser resonator.

27. An exposure method according to claim 25, wherein said light having the first wavelength is an $F_2$ laser beam, and said light having the second wavelength is an ArF excimer laser beam.

28. An exposure method according to claim 25, wherein said light having the first wavelength and said light having the second wavelength are generated from a laser beam source different from each other.

29. A manufacturing method for devices manufactured through a transfer step of transferring a pattern of a mask onto a substrate under light having a first wavelength, comprising a step, prior to said transfer step, of optically cleaning an optical member with irradiating light having a second wavelength longer than said light having the first wavelength, said optical member located on the optical path of said light having the first wavelength, to thereby optically clean said optical member.

30. A cleaning method in which light having a second wavelength longer than light having a first wavelength is irradiated onto an optical member located in an optical path of the light having the first wavelength, in an exposure apparatus that transfers a pattern of a mask onto a substrate under said light having the first wavelength, to thereby optically clean the optical member.

31. An gas replacement method for an optical instrument according to claim 1, wherein the predetermined energy beam is emitted toward the space on said light source side among said plurality of spaces, and said plurality of spaces are subjected to gas replacement from the space on the light source side, sequentially along the traveling direction of said energy beam.

* * * * *